United States Patent
Yamaguchi et al.

(10) Patent No.: US 8,860,057 B2
(45) Date of Patent: Oct. 14, 2014

(54) LIGHT EMITTING DEVICE AND MANUFACTURING METHOD OF THE SAME

(75) Inventors: Seiji Yamaguchi, Kiyosu (JP); Koji Tasumi, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/550,529

(22) Filed: Jul. 16, 2012

(65) Prior Publication Data

US 2013/0075767 A1    Mar. 28, 2013

(30) Foreign Application Priority Data

Sep. 26, 2011 (JP) .................... 2011-208631

(51) Int. Cl.
| | | |
|---|---|---|
| *H01L 33/00* | (2010.01) | |
| *H01L 33/50* | (2010.01) | |
| *H01L 33/54* | (2010.01) | |
| *C03B 19/06* | (2006.01) | |
| *H01L 25/075* | (2006.01) | |
| *H01L 33/56* | (2010.01) | |

(52) U.S. Cl.
CPC ............ *H01L 25/0753* (2013.01); *H01L 33/50* (2013.01); *H01L 33/54* (2013.01); *H01L 33/56* (2013.01); *C03B 19/063* (2013.01)
USPC ............................................ 257/98; 257/100

(58) Field of Classification Search
CPC .......... H01L 33/50; H01L 33/54; H01L 33/56
USPC ................................... 257/98, 100
See application file for complete search history.

(56) References Cited

U.S. PATENT DOCUMENTS

| | | | |
|---|---|---|---|
| 2005/0161771 A1 | 7/2005 | Suehiro et al. | |
| 2006/0261364 A1* | 11/2006 | Suehiro et al. | ................. 257/100 |
| 2008/0068845 A1 | 3/2008 | Aida et al. | |
| 2008/0074029 A1* | 3/2008 | Suehiro | ......................... 313/487 |
| 2008/0284310 A1* | 11/2008 | Suehiro | ......................... 313/498 |

(Continued)

FOREIGN PATENT DOCUMENTS

| | | |
|---|---|---|
| JP | 2008-041844 A | 2/2008 |
| JP | 2008-071837 A | 3/2008 |

(Continued)

OTHER PUBLICATIONS

Japanese Notification of Reasons for Refusal dated Jan. 7, 2014, with English translation.

(Continued)

*Primary Examiner* — David Vu
*Assistant Examiner* — Brandon Fox
(74) *Attorney, Agent, or Firm* — McGinn IP Law Group, PLLC

(57) ABSTRACT

The light emitting device 10 comprises a mounting substrate 11, LED chips 20 flip-chip bonded on the mounting substrate 11, and a glass sealing member 30 made of a plate-shaped glass material that seals the LED chips 20 formed on the mounting substrate 11. Here, the glass sealing member 30 is in a state in which fine voids are almost evenly dispersed and distributed between the powder grains of the glass material, and the powder grains are connected with each other, and the fine bumps/dips 30a are almost evenly dispersed and distributed on the surface of the glass sealing member 30.

15 Claims, 3 Drawing Sheets

(56) References Cited

U.S. PATENT DOCUMENTS

| | | |
|---|---|---|
| 2011/0101399 A1 | 5/2011 | Suehiro et al. |
| 2011/0114989 A1 | 5/2011 | Suehiro et al. |
| 2012/0025245 A1* | 2/2012 | Nakamura et al. .............. 257/98 |

FOREIGN PATENT DOCUMENTS

| | | | |
|---|---|---|---|
| JP | 2008071837 A | * | 3/2008 |
| JP | 2008-270563 A | | 11/2008 |
| JP | 2010-157637 A | | 7/2010 |
| JP | 2011-097020 A | | 5/2011 |
| JP | 2011-129862 A | | 6/2011 |
| WO | WO 2004/082036 A1 | | 9/2004 |

OTHER PUBLICATIONS

Japanese Office Action dated Jun. 17, 2014 with an English translation.

* cited by examiner

LIGHT EMITTING DEVICE AND MANUFACTURING METHOD OF THE SAME

BACKGROUND OF THE INVENTION

1. Field of the invention

The present invention relates to a light emitting device and a manufacturing method of the same. More specifically, the present invention relates to a light emitting device having LED chips mounted on a mounting substrate sealed with a glass material, and a manufacturing method of the same.

2. Description of the related art

Conventionally the following light emitting device has been developed: LED chips are flip-chip bonded on a mounting substrate, and a plate-shaped glass material (glass plate) is hot pressed on the mounting substrate, so that the glass plate is taken as a glass sealing member and the LED chips are glass sealed (see: Patent References 1 through 3).

For this light emitting device, a plurality of LED chips can be sealed en bloc by the glass sealing member, so that the productivity is good.

It is also possible to avoid heat damage of the LED chips caused by overheat, as glass sealing can be carried out in a short time near the softening point of the glass plate.

According to the technology disclosed in Patent Reference 2, a powder mixture is prepared by mixing a powdery glass material and a powdery phosphor; after the powder mixture is melted, the powder mixture is solidified to form a phosphor-dispersed glass; the obtained phosphor-dispersed glass is used as the glass sealing member, so that the phosphor is pumped by the light emitted from the LED chip to generate a wavelength converted light; as a result, it is possible to reduce uneven color and, at the same time, to increase the light emitting efficiency.

According to the technology disclosed in Patent Reference 3, a glass prepared by melting a powdery glass material followed by solidification is used as the glass sealing member, so that fine voids are dispersed inside the glass sealing member; as a result, the light emitted from the LED chip is diffused by the voids; consequently, it is possible to increase the efficiency in output of the light.

Patent Reference 1:WO2004/082036
Patent Reference 2:JP-A-2008-071837
Patent Reference 3:JP-A-2008-270563

In the method for forming the glass sealing member, first of all, a glass plate is superposed on the upper surface (the mounting surface of the LED chips) of the mounting substrate where the LED chips are flip-chip bonded; then, while the mounting substrate and the glass plate are superposed with each other, the mounting substrate and the glass plate are set between the lower die and the upper die of a hot press processing device; then, in the sealing atmosphere, while the lower die and the upper die are heated, hot press operation is carried out by pressing the mounting substrate and the glass plate; as a result, the glass plate is hot-press bonded on the glass plate, and the LED chips are glass sealed on the mounting substrate by the hot softened glass plate; the LED chips are glass sealed in this way.

Here, the glass plate is prepared by solidifying a glass material in a fully melted state, and it has a smooth surface. In addition, the inner surface of the upper die is also smooth.

Consequently, when hot press processing is carried out, the sealing atmosphere enters between the upper die and the glass plate. The sealing atmosphere is left in between the upper die and the glass plate, because there is no way for the sealing atmosphere to escape. As the glass plate is hot pressed on the mounting substrate in this state, dips caused by lumps of the residual sealing atmosphere (known as "air trap") are formed on the surface of the glass plate, degrading the flatness of the surface of the glass plate as the glass sealing member, which is undesirable.

If dips are formed on the surface of the glass sealing member and its flatness degrades, light emitted from the LED chips cannot be normally output, so that the light emitting efficiency of the light emitting device decreases. As a result, the light emitting device becomes a defective product, degrading the yield.

SUMMARY OF THE INVENTION

The object of the present invention is to solve the aforementioned problems by providing a light emitting device that can prevent generation of dips on the surface of the glass sealing member, and a manufacturing method of the light emitting device.

The present inventors have performed extensive research in order to solve the aforementioned problems. As a result of the research, the following aspects of the present invention are reached.

<First Aspect>

The first aspect relates to a light emitting device, comprising a mounting substrate, LED chips flip-chip bonded on the mounting substrate, and a glass sealing member formed on the mounting substrate and made of a plate-shaped glass material that seals the LED chips, wherein fine voids are almost evenly dispersed and distributed between powder grains of the glass material, the powder grains are in a state of being connected with each other, and fine bumps/dips are almost evenly dispersed and distributed on a surface of the glass sealing member.

According to the first aspect, when hot press operation is carried out for forming the glass sealing member, even when the sealing atmosphere enters between the upper die of the hot press device and the plate-shaped glass material (glass plate), the sealing atmosphere can still escape into the bumps/dips on the surface of the glass plate, so that no large lumps of the sealing atmosphere can be left between the upper die and the glass plate, and, the glass plate is hot-press bonded on the mounting substrate in this state.

Because no large lumps of the sealing atmosphere can be left on the surface of the glass plate, no dips can be formed due to the large lumps of the sealing atmosphere, and the surface of the glass sealing member can be formed flat.

<Second Aspect>

The second aspect relates to the light emitting device according to the first aspect and having a powder of a material having a melting point higher than the transition point of the glass material almost evenly dispersed and distributed.

According to the second aspect, when a phosphor material is used as the material doped in the glass material, the same operation and effect as those of Patent Reference 2 can be realized.

In addition, the same operation and effect as those of Patent Reference 3 can be realized by using a light diffusing material that diffuses the light of LED chips as the material doped in the glass material.

<Third Aspect>

The third aspect relates to a manufacturing method of the light emitting device according to the first aspect: comprises a step in which the powder of the glass material is heated to a temperature over a softening point and sintered so that fine voids are almost evenly dispersed and distributed between the powder grains of the glass material and the powder grains are in the state of being connected with each other, and the glass material is processed to a plate shape to form a glass plate; and a step in which the glass plate is superposed on the mounting surface of the mounting substrate having the LED chips flip-chip bonded thereon, and, while the mounting substrate and the glass plate are superposed with each other, the mounting substrate and the glass plate are set between a lower die and an upper die of a hot press device, and the lower die and upper die are heated in a sealing atmosphere while a pressure is applied on the mounting substrate and the glass plate so that the mounting substrate and the glass plate are hot pressed so as to be hot-press bonded, and, the LED chips are glass-sealed by the hot softened glass plate on the mounting substrate so as to form the glass sealing member.

Consequently, the same operation and effect as those in the first aspect can be realized according to the third aspect.

<Fourth Aspect>

The fourth aspect relates to the manufacturing method of the third aspect, wherein when the powder of the glass material is heated to a temperature over the softening point and sintered, the powder of a material having a melting point higher than the transition point of the glass material is mixed with the powder of the glass material.

As a result, the same operation and effect as those in the second aspect can be realized according to the fourth aspect.

DESCRIPTION OF THE PREFERRED EMBODIMENTS

The embodiments of the present invention will be explained in the following with reference to the drawings. The same keys are adopted throughout the embodiments, no the same keys will not be explained repeatedly.

In order to facilitate explanation, the various figures are schematic illustrations with enlarged dimensions and shapes as well as configuration sites of the various structural members in the various embodiments. The dimensions, shapes and configuration sites shown here are different from the actual structural members.

Figure 1:
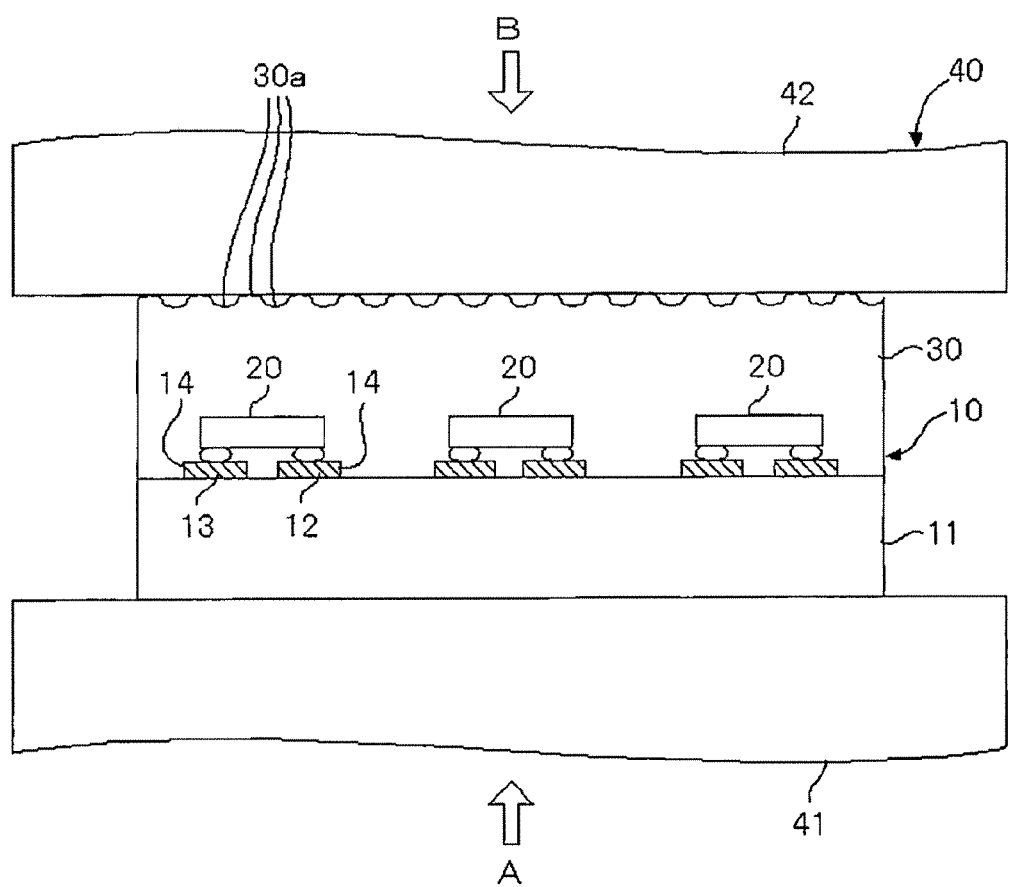
FIG. 1 is a schematic vertical cross-sectional view illustrating the state of hot press operation of the light emitting device 10 in an embodiment of the present invention.

As shown in FIG. 1, the light emitting device 10 in this embodiment includes a mounting substrate 11, a P-side (anode side) internal wiring pattern (circuit pattern) 12, an N-side (cathode side) internal wiring pattern 13, bumps 14. LED chips (elements) 20, a glass sealing member 30, etc. Here, a hot press device 40 (a lower die 41 and an upper die 42) is used to carry out the hot press operation.

The mounting substrate 11 is made of a ceramic plate member. The P-side internal wiring pattern 12 and the N-side internal wiring pattern 13 are formed on the surface of the mounting substrate 11.

The wiring patterns 12, 13 are made of multilayer films of high-conductivity metals (such as multilayer films formed by sequentially laminating copper or tungsten, nickel, and gold from the bottom layer).

A plurality of (three in the example shown in the figure) LED chips 20 are mounted on the mounting substrate 11 by means of flip-chip bonding using bumps 14 on the P-side internal wiring pattern 12 and the N-side internal wiring pattern 13, respectively.

That is, each of LED chips 20 includes an N-type semiconductor layer, a P-type semiconductor layer, an N-side (cathode side) pad electrode, and a P-side (anode side) pad electrode (all of which are not shown in the drawing).

Here, the P-side pad electrode formed on the P-type semiconductor layer of each of the LED chips 20 and the P-side internal wiring pattern 12 are connected with each other via a bump 14.

Also, the N-side pad electrode formed on the N-type semiconductor layer of each of LED chips 20 and the N-side internal wiring pattern 13 are connected with each other via a bump 14.

Here, the bumps 14 may be made of gold, solder, etc.

The glass sealing member 30 is made of a transparent plate-shaped glass material (glass plate) as an inorganic sealing material, and the LED chips 20 mounted on the mounting substrate 11 are glass sealed by it.

The method for forming the glass plate as glass sealing member 30 is as follows: first of all, the bulk material of the glass material is pulverized to form a powdery glass material with an appropriate grain size (with, for example, a mean grain size of 50 µm). Then, the powdery glass material is accommodated in a vessel. While an appropriate pressure (for example, 20 kg/cm2) is applied, heating is carried out to a temperature (such as 580° C.) higher than the softening point, no that the glass material is sintered. As a result, a bulk material is formed in a state wherein the powder grains of the glass material are connected to each other while fine voids are almost evenly dispersed and distributed between the powder grains of the glass material. The formed bulk material is then processed by slicing to an appropriate thickness (for example, 0.5 mm).

For example, the glass material that forms the glass sealing member 30 is a ZnO—B2O3-SiO2-Nb2O5-Na2O—Li2O base glass material.

However, the composition of the glass material is not limited to the aforementioned composition. For example, it may be free of Li2O, and ZrO2, TiO2, etc. may be contained as the arbitrary ingredients.

Here, any composition of the glass material may be adopted as long as the transition point (Tg) is lower than the heat resistant temperature of the LED chips 20, and the thermal expansion coefficient (a) is equal to that of the mounting substrate 11.

Examples of the glass materials that meet the aforementioned conditions include the phosphate base glass, lead glass, etc. in addition to the ZnO—SiO2-R2O base glasses (where R represents at least one type of the element selected from Li, Na, K, and other I-group elements).

In this connection, the ZnO—SiO2-R2O base glass is preferred over the phosphate base glass in that it has better humidity resistance, and over the lead glass in that it does not have environment problem.

The method for forming the glass sealing member 30 is as follows. First of all, a glass plate is superposed on the upper surface (the mounting surface of the LED chips 20) of the mounting substrate 11 where the LED chips 20 are flip-chip bonded. Then, while the glass plate is superposed on the mounting substrate 11, the mounting substrate and the glass plate are set in between the lower die 41 and the upper die 42 of the hot press device 40. Then, internal heaters contained in the lower die 41 and the upper die 42 are used to heat the two dies 41 and 42 in the sealing atmosphere, while the mounting substrate 11 and the glass plate are pressed in the directions indicated by arrows A and B for hot press operation. As a result, the glass plate is hot-press bonded on the mounting substrate 11, so that the LED chips 20 are glass sealed on the mounting substrate 11 by the hot softened glass plate.

Here, for example, the sealing atmosphere is made of nitrogen gas or other inert gas.

Here, the inner surface of the upper die 42 is made smooth. As a result, when the surface of the glass plate as the glass sealing member 30 is smooth, in the hot press operation, the sealing atmosphere enters between the upper die 42 and the glass plate. Because there is no way for the sealing atmosphere to escape, the sealing atmosphere is left in between the upper die 42 and the glass plate, while the glass plate is hot-press bonded on the mounting substrate 11. Consequently, dips (known as "air trap") are formed on the surface of the glass plate due to the residual sealing atmosphere, and the flatness of the surface of the glass plate degrades, which is undesirable.

When dips are formed and flatness degrades on the surface of the glass sealing member 30, the light emitted from the LED chips 20 cannot be normally output, decreasing the light emitting efficiency of the light emitting device 10. As a result, the light emitting device 10 becomes a defective product, and the yield degrades.

Now, the glass plate as the glass sealing member 30 has fine voids almost evenly dispersed and distributed between the powder grains of the glass material, and the powder grains are connected to each other. Consequently, fine bumps/dips 30a are almost evenly dispersed and distributed on the surface.

Consequently, in the hot press operation, even when the sealing atmosphere enters between the upper die 42 and the glass plate, the sealing atmosphere still can escape into the fine bumps/dips 30a on the surface of the glass plate, so that no large lumps of the sealing atmosphere are left in between the upper die 42 and the glass plate as the glass plate is hot-press bonded on the mounting substrate 11.

As a result, because no large lumps of the sealing atmosphere are left on the surface of the glass plate, no dips (known as "air trap") are formed due to the large lumps of the sealing atmosphere, and thus the surface of the glass sealing member 30 can be formed flat.

In this way, according to the present embodiment, it is possible to provide a light emitting device 10 and a manufacturing method of the light emitting device 10 that can prevent formation of dips on the surface of the glass sealing member 30.

For the light emitting device 10, as the surface of the glass sealing member 30 can be formed flat, the light emitted from the LED chips 20 can be output normally, increasing the light emitting efficiency of the light emitting device 10, and the yield becomes higher, as the light emitting device 10 does not become defective product.

In addition, at the glass sealing member 30 of the light emitting device 10, because the fine voids are almost evenly dispersed and distributed between the powder grains of the glass material, the light emitted from the LED chips 20 can diffuse by means of the fine voids, so that it is possible to increase the light output efficiency.

As far as the size of the fine bumps/dips 30a on the surface of the glass plate as the glass sealing member 30 is concerned, the size should be selected appropriately to ensure that the sealing atmosphere that has entered between the upper die 42 and the glass plate can be exhausted reliably, and the light emitting efficiency of the light emitting device 10 does not decrease.

The size of the fine bumps/dips 30a on the surface of the glass plate should be selected appropriately as desired by adjusting the grain size of the powder grains of the glass material, the applied pressure and the heating temperature when the glass plate is formed.

However, according to the technology described in Patent Reference 2, a powder mixture is prepared by mixing a powdery glass material and a powdery phosphor; after the powder mixture is melted, it is solidified to form a phosphor-dispersed glass; the obtained phosphor-dispersed glass is used as the glass sealing member.

For the glass with phosphor dispersed therein in Patent Reference 2, the surface is smooth, as the glass is formed by solidification after melting of the powder mixture, so that the aforementioned problems take place.

Fine voids are dispersed in the glass sealing member according to the technology described in Patent Reference 3. However, although there are voids inside the glass sealing member, it is impossible to realize the same operation and effect as those in the present embodiment of the present invention as long as there are no bumps/dips on the surface of the glass sealing member.

Also, Patent Reference 3 did not disclose or indicate both the specific method for forming the voids and formation of voids on the surface of the glass sealing member.

Consequently, it is difficult even for the specialists to reach the present embodiment of the present invention on the base of Patent Reference 3, and it is impossible for the person skilled in the art to predict the aforementioned operation and effect of the present embodiment of the present invention.

<Another Embodiment>

The present invention is not limited to the aforementioned embodiment. The same operation and effect as those in the aforementioned embodiment can also be realized by the following specific aspects.

Figure 2:
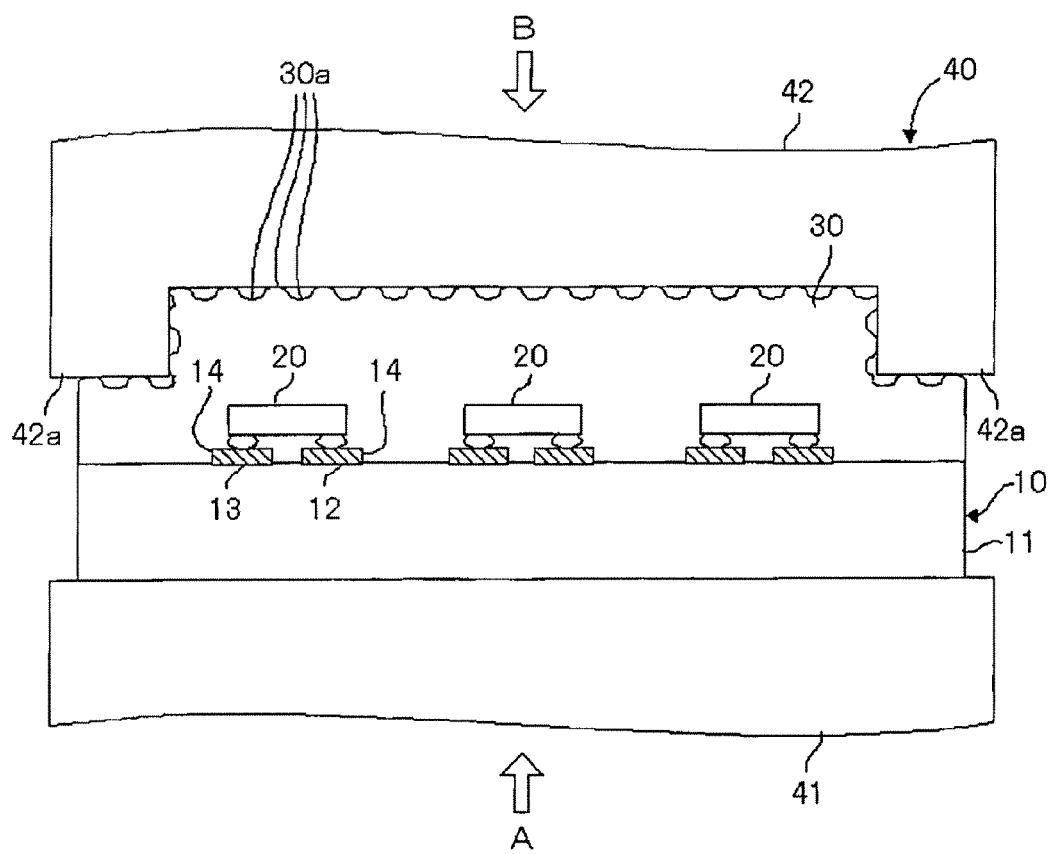
FIG. 2 is a schematic vertical cross-sectional view illustrating the state of hot press operation of the light emitting device 10 in another embodiment of the present invention.

[A] As shown in FIG. 2, the outer peripheral portion 42a of the upper die 42 of the hot press device 40 is of an outer peripheral frame attached type so that it protrudes in the upper edge frame shape, when the surface of the glass plate as the glass sealing member 30 is smooth, the sealing atmosphere that entered between the upper die 42 and the glass plate is sealed by the outer peripheral portion 42a, and it can hardly escape, so that the lumps of the sealing atmosphere left on the surface of the glass plate become larger, and the dips on the surface of the glass plate formed due to the lumps of the sealing atmosphere also become larger, so that the aforementioned problems become more significant.

Figure 3:
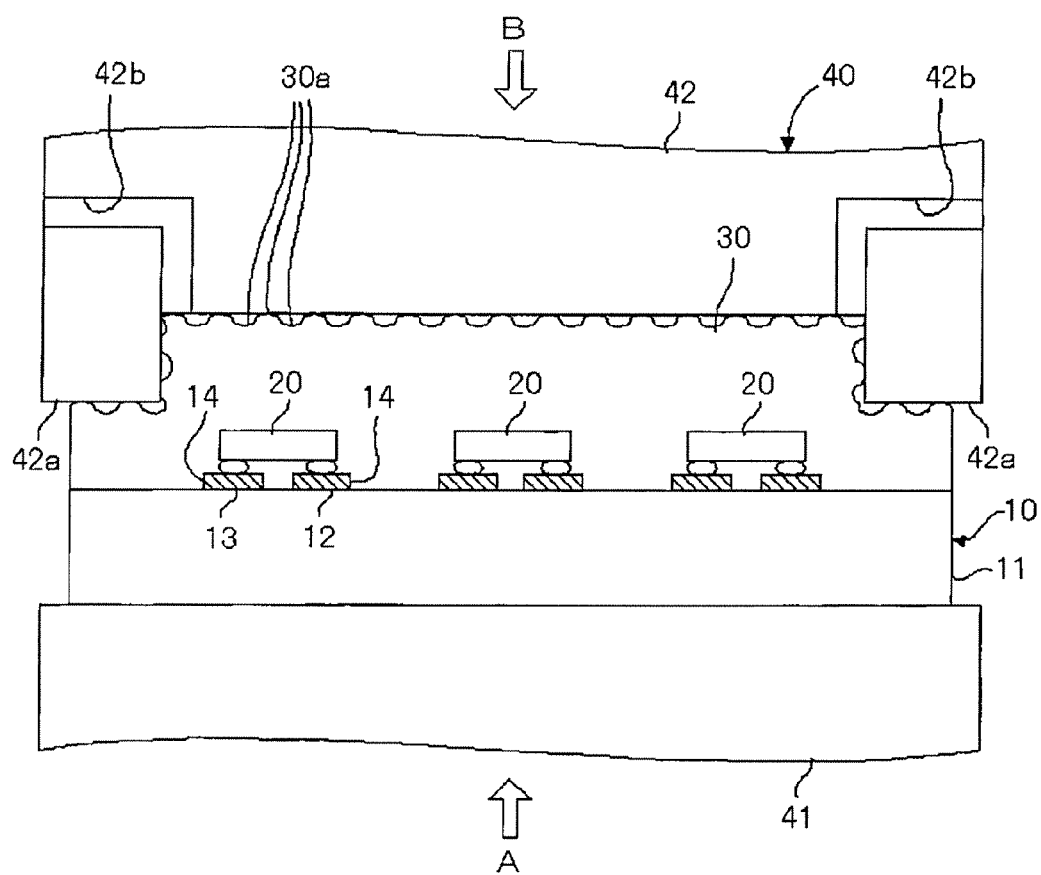
FIG. 3 is a schematic vertical cross-sectional view illustrating the state of hot press operation of the light emitting device 10 in yet another embodiment of the present invention.

As shown in FIG. 3, the outer peripheral portion 42a of the upper die 42 of the hot press device 40 is of an outer peripheral frame attached type so that it protrudes in the upper edge frame shape, and air vent holes 42b are formed through on the inner side of the outer peripheral portion 42a for exhausting the sealing atmosphere. In this case, the sealing atmosphere that has entered between the upper die 42 and the glass plate can be exhausted through the air vent holes 42b. However, the sealing atmosphere is still left in the central portion of the upper die 42, so that the aforementioned problems still take place as it is.

However, if the fine bumps/dips 30a are almost evenly dispersed and distributed on the surface of the glass plate as the glass sealing member 30, even when the upper die 42 shown in FIGS. 2 and 3 is adopted, the aforementioned problems can be reliably solved.

[B] One may also adopt an aspect in which a powder of an additive having a melting point higher than the transition point of the glass material for forming the glass sealing member 30 is almost evenly dispersed and distributed in glass sealing member 30.

In this case, when the phosphor material is used as the additive material, the same operation and effect as those of Patent Reference 2 can be realized.

In addition, the same operation and effect as those of Patent Reference 3 can be realized by using a light diffusion material that diffuses the light of LED chips 20 as the additive material.

The present invention is not limited to the aforementioned aspects and the aforementioned embodiments. Especially, various modifications may be adopted in the range that the person skilled in the art can think of as long as the gist of the present invention is observed. The contents of the papers, patent applications, publications of patents, etc. clearly described in the present specification should be taken as citation of their entire contents.

What is claimed is:

1. A light emitting device, comprising:
    a mounting substrate;
    LED chips flip-chip bonded on the mounting substrate; and
    a glass sealing member formed on the mounting substrate and comprising a plate-shaped glass material that seals the LED chips;
    wherein fine voids are almost evenly dispersed and distributed between powder grains of the glass material, the powder grains comprise a state of being connected with each other, and fine bumps and dips are evenly dispersed and distributed on an outer surface of the glass sealing member.

2. The light emitting device according to claim 1, wherein a powder of a material having a melting point higher than the transition point of the glass material is almost evenly dispersed and distributed on the glass sealing portion.

3. The light emitting device according to claim 2, wherein the material comprises a phosphor material.

4. The light emitting device according to claim 2, wherein the material comprises a light diffusion material.

5. A manufacturing method of the light emitting device according to claim 1, the method comprising:
    heating the powder of the glass material to a temperature over a softening point and sintered so that fine voids are almost evenly dispersed and distributed between the powder grains of the glass material and the powder grains are in the state of being connected with each other, and the glass material is processed to a plate shape to form a glass plate; and
    superposing the glass plate on the mounting surface of the mounting substrate having the LED chips flip-chip bonded thereon, and, while the mounting substrate and the glass plate are superposed with each other, the mounting substrate and the glass plate are set between a lower die and an upper die of a hot press device, and the lower die and upper die are heated in a sealing atmosphere while a pressure is applied on the mounting substrate and the glass plate so that the mounting substrate and the glass plate are hot pressed so as to be hot-press bonded, and, the LED chips are glass-sealed by the hot softened glass plate on the mounting substrate so as to form the glass sealing member.

6. The manufacturing method according to claim 5, wherein when the powder of the glass material is heated to a temperature over the softening point and sintered, the powder of a material having a melting point higher than the transition point of the glass material is mixed with the powder of the glass material.

7. The light emitting device according to claim 1, wherein the powder grains comprise a mean grain size of 50 μm.

8. The light emitting device according to claim 1, wherein the outer surface of the glass sealing member comprises a substantially flat surface.

9. A manufacturing method of the light emitting device according to claim 1, the method comprising:
    heating the powder of the glass material;
    sintering the powder of the glass material so that fine voids are almost evenly dispersed and distributed between the powder grains of the glass material and the powder grains comprise the state of being connected with each other, and the glass material is processed to a plate shape to form a glass plate;
    superposing the glass plate on the mounting surface of the mounting substrate having the LED chips flip-chip bonded thereon;
    setting the mounting substrate and the glass plate between a lower die and an upper die of a hot press device;
    heating the lower die and upper die in a sealing atmosphere while a pressure is applied on the mounting substrate and the glass plate so that the mounting substrate and the glass plate are hot pressed so as to be hot-press bonded; and
    glass-sealing the LED chips by the hot softened glass plate on the mounting substrate so as to form the glass sealing member.

10. The light emitting device according to claim 1, wherein a transition point of the glass material is lower than a heat resistant temperature of the LED chips.

11. The light emitting device according to claim 1, wherein a thermal expansion coefficient of the glass material is equal to a thermal expansion coefficient of the mounting substrate.

12. The light emitting device according to claim 1, wherein the glass material comprises a $ZnO-B_2O_3\text{-}SiO_2\text{-}Nb_2O_5\text{-}Na_2O-Li_2O$ base glass material.

13. The light emitting device according to claim 1, wherein the glass material comprises a phosphate base glass material.

14. The light emitting device according to claim 1, wherein the glass material comprises a lead base glass material.

15. The light emitting device according to claim 1, wherein the fine voids are configured to diffuse light emitted from the LED chips.

* * * * *